United States Patent
Yuda et al.

(10) Patent No.: US 6,889,107 B2
(45) Date of Patent: May 3, 2005

(54) SUPPORT SYSTEM FOR PARTS STANDARDIZATION

(75) Inventors: Shinya Yuda, Hitachi (JP); Hiroyuki Nemoto, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/694,809

(22) Filed: Oct. 29, 2003

(65) Prior Publication Data
US 2004/0153188 A1 Aug. 5, 2004

(30) Foreign Application Priority Data
Jan. 31, 2003 (JP) ........................................ 2003-022978

(51) Int. Cl.[7] ............................................. G06F 19/00
(52) U.S. Cl. ....................................... 700/107; 700/106
(58) Field of Search ................................ 700/106, 107; 705/29

(56) References Cited

U.S. PATENT DOCUMENTS

| | | | |
|---|---|---|---|
| 6,625,607 B1 * | 9/2003 | Gear et al. ................. | 707/101 |
| 2001/0023376 A1 * | 9/2001 | Uchida et al. ............... | 700/101 |

OTHER PUBLICATIONS

U.S. Appl. No. 10/173,018.
Japanese Laid-open No. H09-179892.

* cited by examiner

Primary Examiner—Leo Picard
Assistant Examiner—Ryan Jarrett
(74) Attorney, Agent, or Firm—Antonelli, Terry, Stout & Kraus, LLP

(57) ABSTRACT

The specification discloses a support system for parts standardization, a method therefore, a computer program for executing the method and a recording medium storing the computer program capable of being read out by a computer.

A support system for parts standardization for selecting standard parts from plural parts, which comprises: a first database storage for storing data representing attributes of the plural parts, a second database storage for storing standardization parameter data that can be criteria on judgment whether the plural parts are standard parts, a nearby range input device for preparing a nearby range data upon inputting of numerals corresponding to a parameter name, and a standard parts judging apparatus for judging whether the plural parts are standard parts, upon the databases, standardization parameter data and nearby range data.

24 Claims, 10 Drawing Sheets

ACCUMULATION OF THE NEARBY PRODUCTION QUANTITY OF ALL PARTS

MULTI-DIMENSIONAL DATA

| PART NUMBER | VOLUME | SURFACE AREA | MASS | MAXIMUM VALUE IN X DIRECTION |
|---|---|---|---|---|
| 1 | 77.67 | 15646 | 85.437 | 369.04 |
| 2 | 64.7 | 19098 | 90.58 | 349.36 |
| 3 | 89.14 | 3505 | 106.968 | 384.61 |
| 4 | 98.7 | 10507 | 108.57 | 396.55 |
| 5 | 61.04 | 11489 | 85.456 | 343.31 |
| 6 | 17.54 | 16836 | 22.802 | 236.16 |
| 7 | 84.17 | 11604 | 117.838 | 378.05 |
| 8 | 43.46 | 4494 | 56.498 | 310.05 |
| 9 | 10.08 | 18665 | 13.104 | 200 |
| 10 | 98.23 | 4955 | 137.522 | 395.98 |
| 11 | 56.03 | 4146 | 61.633 | 334.6 |
| 12 | 79.06 | 19043 | 79.06 | 371.01 |
| 13 | 76.59 | 12315 | 84.249 | 367.5 |
| 14 | 69.66 | 17257 | 97.524 | 357.19 |
| 15 | 51.07 | 16472 | 71.498 | 325.42 |
| 16 | 76.05 | 19636 | 83.655 | 366.72 |
| 17 | 15.37 | 12448 | 16.907 | 226.99 |
| 18 | 88.94 | 974 | 106.728 | 384.35 |
| 19 | 93.51 | 17117 | 112.212 | 390.17 |
| 20 | 39.38 | 9186 | 55.132 | 301.01 |
| 21 | 55.61 | 549 | 72.293 | 333.85 |
| 22 | 16.23 | 13036 | 22.722 | 230.73 |
| 23 | 96.16 | 12857 | 105.776 | 393.46 |
| 24 | 86.95 | 9570 | 95.645 | 381.75 |
| 25 | 64.43 | 14603 | 70.873 | 348.92 |

FIG. 3

ACTUAL PRODUCTION DATA

| PART NUMBER | PRODUCTION QUANTITY |
|---|---|
| 1 | 908000 |
| 2 | 678000 |
| 3 | 408000 |
| 4 | 182000 |
| 5 | 299000 |
| 6 | 797000 |
| 7 | 78000 |
| 8 | 577000 |
| 9 | 25000 |
| 10 | 650000 |
| 11 | 32000 |
| 12 | 128000 |
| 13 | 751000 |
| 14 | 630000 |
| 15 | 744000 |
| 16 | 222000 |
| 17 | 803000 |
| 18 | 819000 |
| 19 | 361000 |
| 20 | 583000 |
| 21 | 509000 |
| 22 | 846000 |
| 23 | 65000 |
| 24 | 649000 |
| 25 | 49000 |

ARRANGEMENT DIAGRAM OF COMPONENTS

STANDARD PART JUDGING APPARATUS

NEARBY RANGE DATA

| # | PARAMETER NAME 801 | NEARBY RANGE 802 |
|---|---|---|
| 1 | VOLUME | 10 |
| 2 | SURFACE AREA | 5000 |

NEARBY RANGE DATA INPUTTING INTERFACE

FIG. 10

STANDARD PARTS DATA

| PART NUMBER |
|---|
| 6 |
| 14 |
| 18 |
| 20 |
| 21 |
| 23 |

FIG. 11

FINAL OUTPUT TABLE (LIST)

SELECTED STANDARD PARTS

| PART NUMBER | VOLUME | SURFACE AREA |
|---|---|---|
| 6 | 17.54 | 16836 |
| 14 | 69.66 | 17257 |
| 18 | 88.94 | 974 |
| 20 | 39.38 | 9186 |
| 21 | 55.61 | 549 |
| 23 | 96.16 | 12857 |

FINAL OUTPUT TABLE (MULTI-DIMENSIONAL BOARD)

SIMILAR CONTOUR WITH SIMILAR FUNCTION

RECORDING MEDIUM

SUPPORT SYSTEM FOR PARTS STANDARDIZATION

DETAILED DESCRIPTION OF INVENTION

1. Field of Invention

This invention relates to a method of supporting parts standardization and a support system for carrying out the method that is used for selecting standard parts from plural parts. The specification discloses a support system for parts standardization, a method therefore, a computer program for executing the method and an information-recording medium storing the computer program that is capable of being read out by a computer.

2. Related Art

In the art disclosed in Japanese Laid-open 09-179892, the degree of similarity among parts is computed, and example parts are extracted based on the result of the computation. The standard parts are decided by preparing data of parts including the extracted parts groups.

In the related art, because the similarity of the parts is checked by one representative parameter, i.e. similarity that represents properties, contour characteristics, etc, of the parts, the definition of the similarity is not direct. That is, a user who wants to select standard parts cannot select proper standard parts, unless he or she fully understands the definition. For example, although one attribute has a great influence on the similarity, but another attribute may have little influence thereon. Further, the attributes do not give influence unless it is taken into consideration. In other words, it is difficult to make a proper definition of similarity.

SUMMARY OF INVENTION

It is an object of the present invention to provide a method and system for supporting selection of proper standard parts, regardless of experience of the users.

One feature of the present invention resides in selection wherein a nearby range is decided in advance in selecting standard parts from data of plural parts. Another feature of the present invention resides in that the standard parts are selected based on the actual production quantity of the parts.

A further feature of the present invention resides in that a support system for parts standardization wherein standard parts are selected from plural parts data, which comprises a first storage for a multi-dimensional database representing properties of plural parts, a second storage for actual production database representing production quantity of plural parts, a nearby zone input device for preparing nearby zone data that receives a attribute name which is a parameter name and a nearby zone data corresponding to the attribute name, a standard parts judging device that reads the multi-dimensional data stored in the actual production database, selects standard parts using the nearby zone from the readout data of the plural parts, and outputs standard parts data, and a display for displaying the standard parts data.

The above-mentioned features and other features of the invention will further be explained with reference to claims, the specification and drawings.

BRIEF DESCRIPTION OF DRAWINGS

FIG. 3 shows an example of the actual production data of the used in the support system of this invention.

FIG. 10 shows an example of the standard part data of the invention.

FIG. 11 shows an example of the final display table (list) of the standard part data used in the invention.

DETAILED DESCRIPTION OF PREFERRED EMBODIMENTS

Preferred embodiments of the present invention will be explained with reference to the drawings.

Figure 13A:
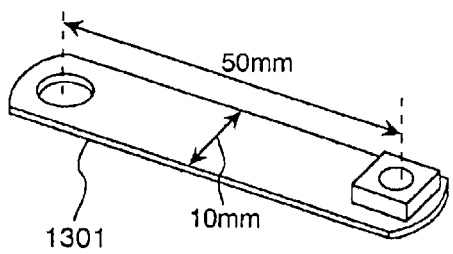
FIGS. 13a and 13b show structures of stays, each having a similar size and contour.
Figure 13B:
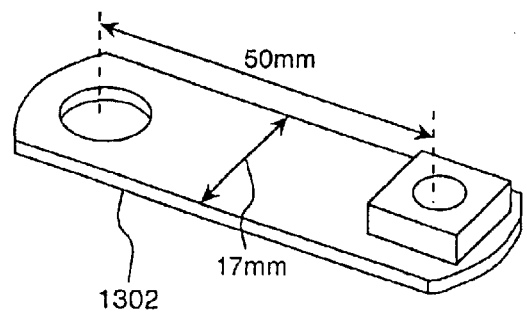

In the specification, the standard parts are defined as parts that are parts to be mandatorily used or are recommended to use in a certain design group or organization. In general, when plural designers design a part, they design it in different contours. For example, take a simple structure as a stay shown in FIG. 13, for example.

In general, a function of the stay is to fasten two parts with a bolt, and the distance between the holes formed in the stay is an important point. In many cases, the stays are exchangeable if they have a width and a hole size within proper ranges. Both stays 1301 and 1302 have the same distance as 50 mm between holes, but their widths are 15 mm and 17 mm, respectively. From the viewpoint of mechanism, there are many situations where the stays 1301 and 1302 are exchangeable. That is, when two designers design independently, there is a high possibility that although the parts perform the same function, they have similar contours but different in details each other.

If new parts are designed, this may lead to lose the chance of cost reduction, which may be achieved by using conventional parts. Furthermore, the cost will increase for maintenance and warehouse fee of the parts, resulting from a new design. This may be a problem to development of new products. The larger the number of designers, the more the variations of the parts will become.

Then, as for the parts that are used frequently, the parts are commonly used in a design group or organizations so as to suppress that the variation of parts increases, by recommending or obliging them to use the parts if possible, as far as they have similar functions. Such parts are called standard parts in this specification. In developing products, using the standardized parts is particularly important for the cost reduction.

In order to select standard parts, we should take into consideration the features of contours such as volume, sizes and specifications such as a rotational number in case of motors, for example. Furthermore, considering a unit price, the quantity of production is also an important criterion of judgment. However, if there are many kinds of similar functional parts in a design group, it will take a long time to compare information of the parts.

Figures 1, 2:
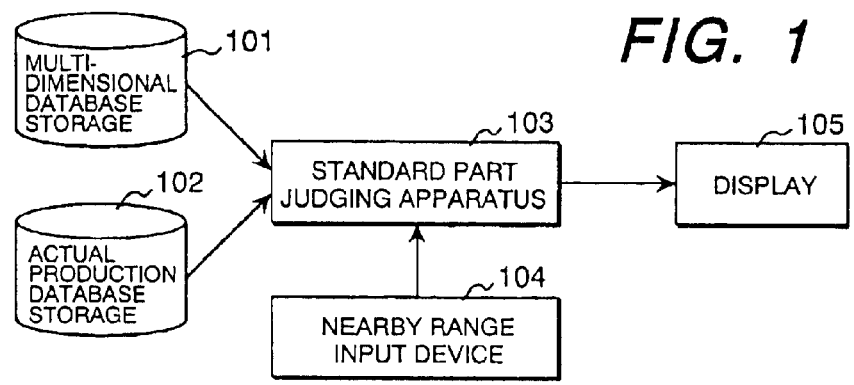
FIG. 1 shows an example of the construction of the support system for parts standardization of this invention.
FIG. 2 shows an example of the multi-dimensional data used in the support system of this invention.

FIG. 1 shows an example of the present invention. The first database storage 101 which is a multi-dimensional database stores and memories multi-dimensional data representing properties of a group of parts or plural parts from which standard parts are selected. The multi-dimensional data stored in the multi dimensional database storage 101 is explained by reference to FIG. 2.

The multi-dimensional data consist of a collection of two or more multi-dimensional data record 202. One multi-dimensional data record 202 consists of attributes 203 and the part number 201. The part number 201 is the data for identifying each multi-dimensional data record 202. Any attribute is acceptable, if the attribute 203 of the parts belongs to an object. Moreover, there is no limit to the number of the attributes.

In FIG. 2, the part numbers 201 are "1", "2", "3" ... "25", and "volume", "surface area", "mass(weight)", and the "maximum value in the direction of X" are used as attributes 203 of parts. The attributes 203 of the parts of the multi-dimensional data record 202 corresponding to "1" of the part number 201 is "77.67" for the parameter "volume", and is "15,646" for the parameter "surface area."

The actual production database storage 102 in FIG. 1 is the second database, and is a device, which memorizes an actual production quantity corresponding to each of parts contained in the group of parts used as the objects from which the standard parts are selected.

Actual production data stored in the actual production database storage 102 are explained with reference to FIG. 3. The actual production data consist of a collection of two or more actual production data record 302. One actual production data record 302 consists of combination of the part numbers 301 and the quantity of production 303. The part number is the data for identifying each actual production data record 302. Here, identifiers corresponding to the part numbers of a multi dimensional database 101 are used. In FIG. 3, the part numbers are "1", "2", "3" ... , "25." The quantity of production corresponding to the part number "1" is "908,000." This shows that 908,000 of the product were produced by the company to which the designer or designers belong or by another company in accordance with an order issued by the company to which the designer or the designers belong, before the part number "1" was finally registered in the actual production database storage 102.

The nearby range input unit 104 is the apparatus which stores the inputted nearby range data by a user. The nearby range data inputted by the nearby range input unit 104 is explained with reference to FIG. 8.

Figures 8, 9:
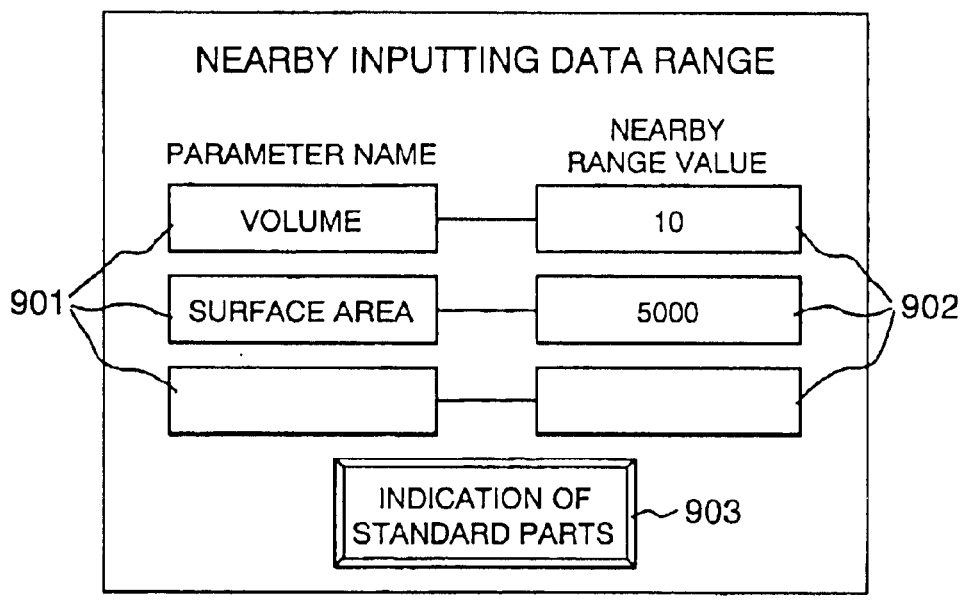
FIG. 8 shows an example of the near range data in this invention.
FIG. 9 shows an example of the user interface for the near range data input used in this invention.

The nearby range data are a pair of a parameter 801 for specifying the nearby range and a value 802 of the nearby range. The parameter name 801 which specifies the nearby range inputted in the nearby range must be included in the set of the attribute 203 of the parts of the multi dimensional database storage 101. The nearby range data will be inputted with a user interface as shown in FIG. 9.

The standard part judging apparatus 103 is an apparatus for selecting out the parts suitable for standard parts, based on the data inputted by the user from the nearby range input unit 104, using the data of the multi dimensional database 101 and the actual production data base 102.

Figure 5:
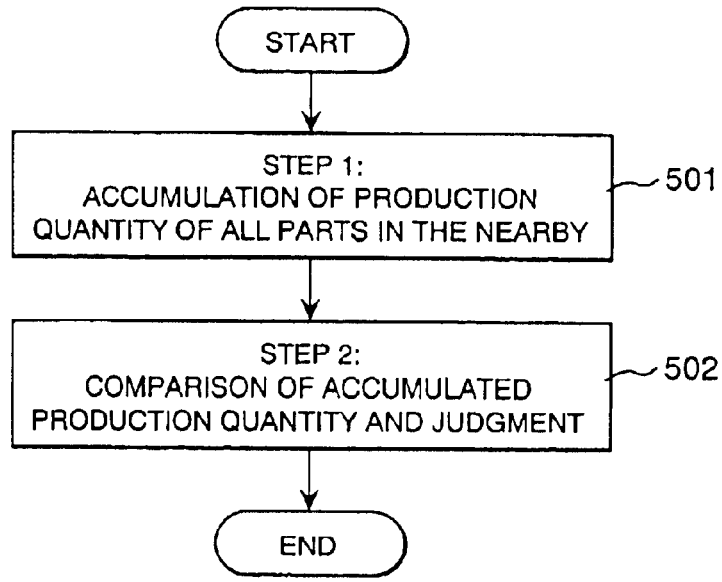
FIG. 5 shows an example of the standard part judging apparatus of this invention.

A concrete procedure will be explained later with reference to FIG. 5. Display 105 displays the parts selected by the standard part judging apparatus 103 to a user.

Figure 4:
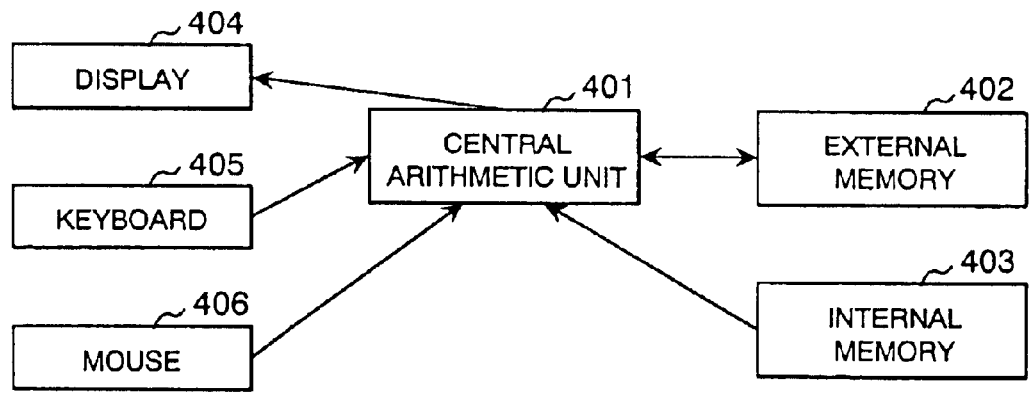
FIG. 4 shows an example of an apparatus construction, which realizes the support system of this invention.

In the apparatus construction shown in FIG. 4, a procedure of obtaining standard parts, using a desired attribute is shown. The central arithmetic unit 401 includes the standard part judging apparatus 103 and the nearby range input unit 104. External memory storage 402 includes the multi dimensional database 101 and the actual production database 102. The internal memory 403 stores the nearby range data inputted by the nearby range input unit 104.

The display 404 displays the standard parts that are the output of the nearby range input unit 104 and the standard part judging apparatus 103. A keyboard 405 and a mouse 406 receive a user's input and directions in the nearby range input unit 104.

The user will use the keyboard 405 or the mouse 406 for the nearby range input unit 104, will input the nearby range, and will give directions of selection and displaying of the standard parts. After inputting the kind of attributes which specify the nearby range into the column 901 for inputting a parameter name, followed by inputting the nearby range value corresponding to the parameter name into the column 902 for inputting the nearby range value, the button 903 which directs selection and displaying of the standard parts is clicked with the mouse.

The standard part judging apparatus 103 outputs standard part data in accordance with the procedure explained below, i.e., the procedure shown in FIG. 5. The procedure is explained. The standard part judging apparatus comprises step 1 (501) and step 2 (502). Step 1 (501) is a step, which holds the accumulated value of the production quantity of the parts near the respective parts on the memory, the value being related with the part number.

Figure 6:
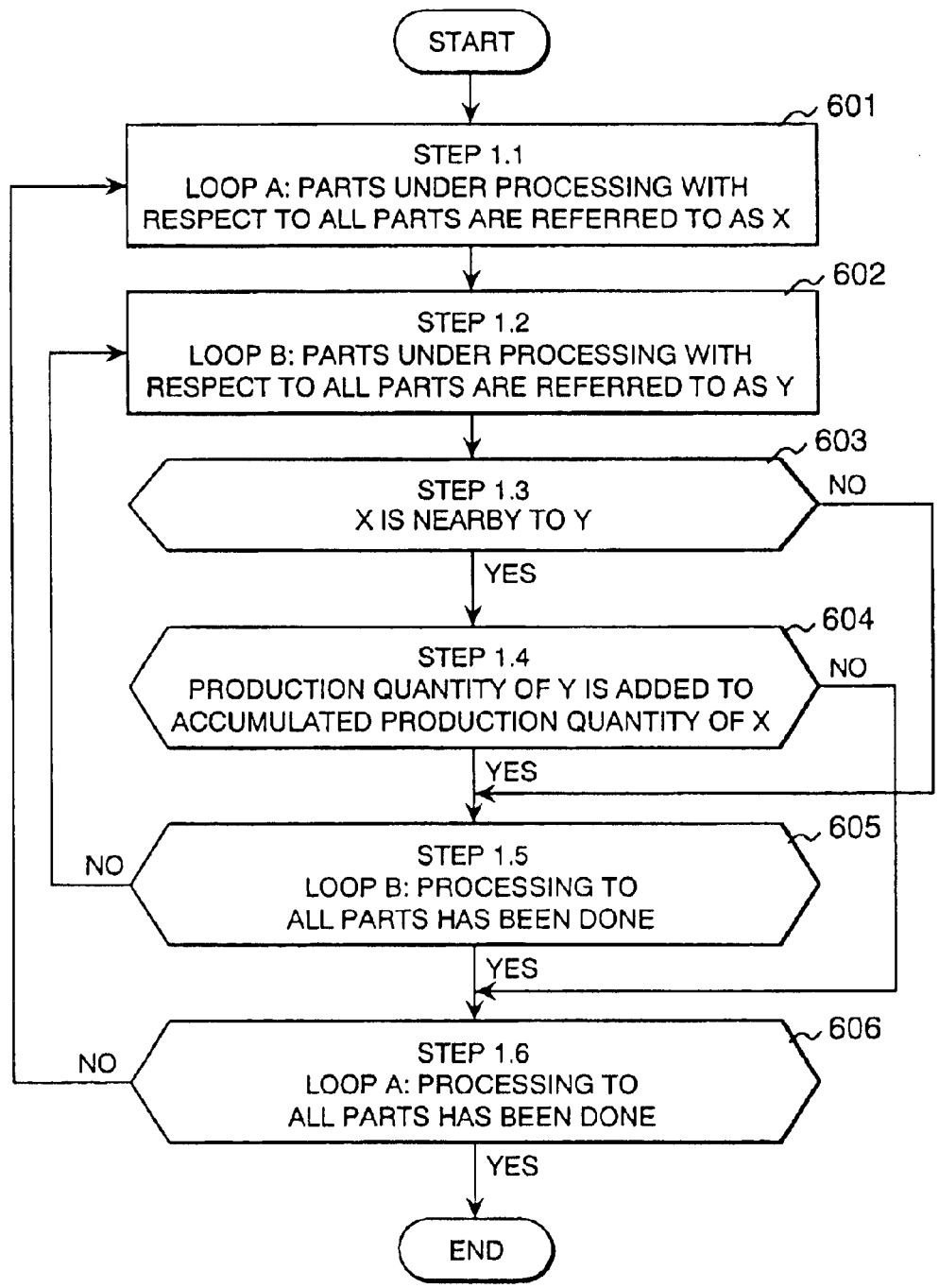
FIG. 6 shows an example of a procedure for the standard part judging apparatus, wherein the first half of the procedure shows a flow of accumulation of production quantity of the parts in the nearby to the parts.

Step 1 (501) is explained by reference to FIG. 6. One part processed by repetition processing between step 1.1 (601) and step 1.6 (606) is taken out from the multi dimensional database 101 at step 1.1 (601). This part is called X. At this time, the accumulated quantity of the production of X that was used during processing is cleared to 0.

At step 1.2 (602), one part processed by the repetition processing between step 1.2 (602) and step 1.5 (605) is taken out from the multi dimensional database 101. This part is called Y.

At step 1.3 (603), it is judged whether part Y is near the part X by the method described below. The pair of parameter names and the nearby range is acquired from the nearby range data inputted from the nearby range input unit 104. Here, the pair is defined as the parameter name P and range B. The values corresponding to the parameter names of parts X and parts Y are acquired, and a difference between them is acquired. The absolute value of the difference and range B are compared; when the range B is smaller than the other, this parameter name P is judged that the parts Y are near the parts X. When all parameters are judged whether they are near each other or not, and whether parts Y are near the parts X or not.

The above-mentioned step 1.3 (603) is again explained by reference to the nearby range data shown in FIG. 8 about the parts of the part number "1" and "16." of FIG. 2. Let the part number "1" as parts X, and let the part numbers "16" as parts Y. One of the nearby range data is a parameter name "volume" and the nearby range "10". The value corresponding to the parameter name "volume" of parts X is "77.67", and is "76.05" for parts Y. The absolute value of the difference between them is 1.62 and is smaller than the nearby range "10". Therefore, parts X and parts Y are near each other with respect to the parameter "volume".

The second of the nearby range data is a parameter name "surface area" and the near range "5,000". The value corresponding to the parameter name "surface area" of parts X is "15,646", and is "19,636" for parts Y. The absolute value of the difference is 3,990, which is smaller than the nearby range "5,000". Therefore, parts X and parts Y are near each other with respect to the parameter "surface area".

Since all the nearby range data are judged as being near each other, it is judged that parts X and parts Y are near each other. When parts Y are near the parts X, processing is advanced to step 1.4 (604), and when they are not near, processing is advanced to step 1.5 (605).

At step 1.4 (604), the quantity of production of parts Y is acquired from the actual production database storage 102, and the quantity of production of parts Y is added to the accumulated quantity of production of parts X. The accumulated quantity of production of parts X is updated to the value.

At Step 1.5 (605), it is judged whether processing has been done to all the parts Y contained in the multi dimensional database 101 or not. When the processing was over, the processing is advanced to step 1.6 (606). If the processing to all has not been done, the processing is returned to step 1.2 (602), and the processing is advanced to the following parts.

At Step 1.6 (606), it is judged whether processing of all the parts X contained in the multi dimensional database was completed or not. If the processing was done, it is finished. When the processing of all is not completed, the processing returns to step 1.1 (601) and processing is advanced to the following parts.

Figure 7:
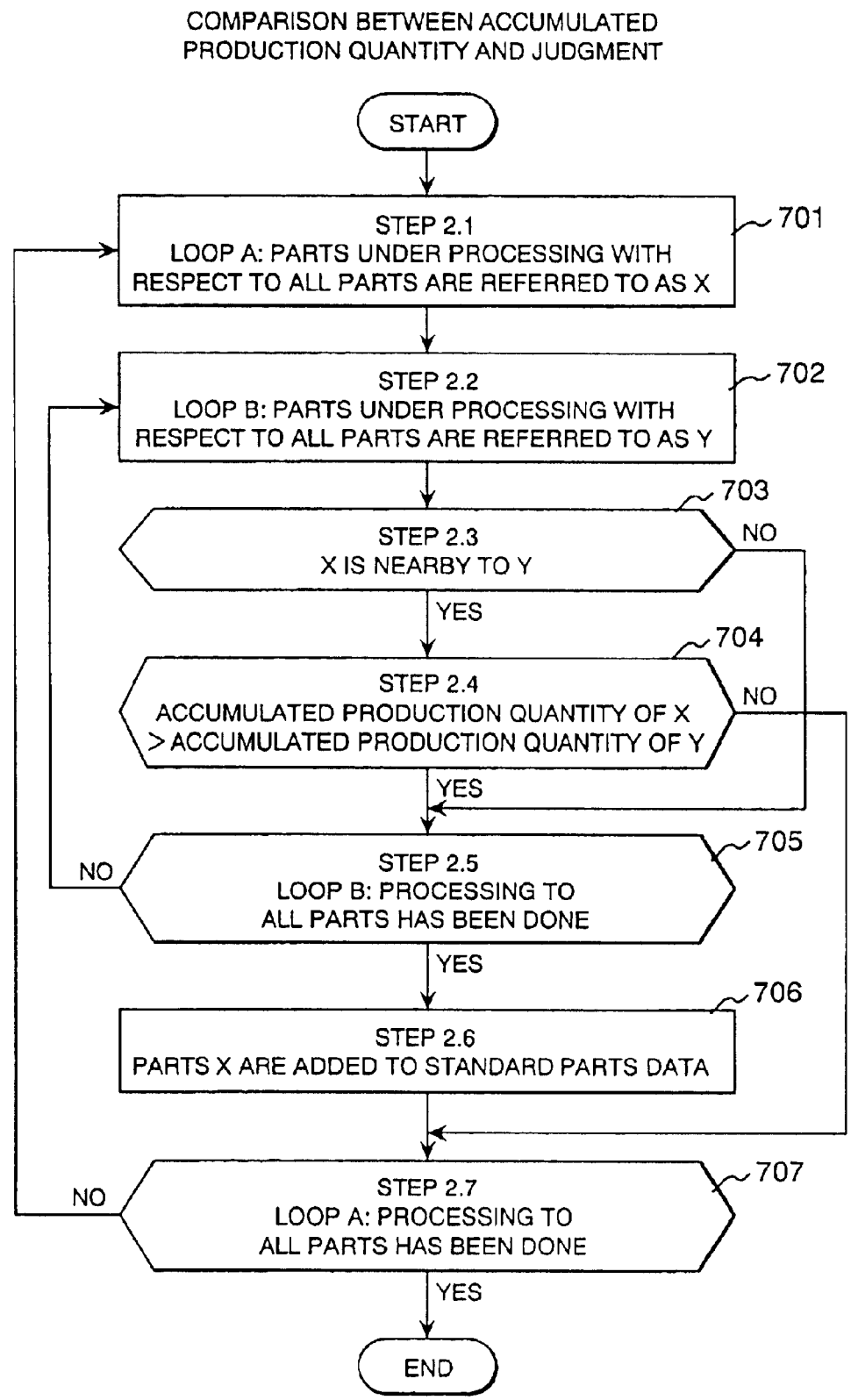
FIG. 7 shows the second half of the procedure of the standard part judging apparatus of the invention, wherein the flow chart shows a procedure for judging by comparing the accumulated production quantity.

Step 2 (502) is a step for comparing among the accumulated values acquired at step 1 (501) of parts, and for selecting the standard parts. Step 2 (502) is explained by reference to FIG. 7.

One part processed by repetition processing between step 2.1 (701) and step 2.7 (707) is taken out from the multi dimensional database storage 101 at step 2.1 (701). This part is called X.

At Step 2.2 (702), one part that is to be processed by the repetition processing between step 2.2 (702) and step 2.5 (705) is taken out from the multi dimensional database 101. This part is called Y.

At Step 2.3 (703), it is judged whether parts Y are near the parts X or not. The method of the judgment of the nearby range will be judged by the same method as the above-mentioned step 1.3 (603).

When parts Y are near parts X, processing is advanced to step 2.4 (704), and when they are not near parts X, the processing is advanced to step 2.5 (705).

At step 2.4 (704), the accumulated quantity of production of parts Y and the accumulated quantity of production of parts X are compared, wherein the both quantities have been calculated at step 1.

When the accumulated quantity of production of parts Y is larger than that of parts X, the processing is advanced to step 2.7 (707). When the accumulated quantities of production of parts Y and parts X are the same, each of the quantities is measured. When the quantity of production of parts Y is larger than the quantity of production of parts X, the processing is similarly advanced to step 2.7 (707). When the fact is not, the processing is advanced to step 2.5 (705).

At step 2.5 (705), it is judged whether processing of all the parts Y contained in the multi dimensional database has been completed. When it is completed, the processing is advanced to step 2.6 (706). When the processing to all is not completed, it is returned to step 2.2 (702) and the processing is advanced to the processing of the following parts. Data of parts X are stored in the standard part data at step 2.6 (706).

At step 2.7 (707), it is judged whether processing to all parts X contained in a multi dimensional database 101 has been done. If the processing to all was done, the processing is finished. When the processing to all has not been completed, the processing is returned to step 2.1 (701) and the processing is advanced to the following parts.

The data selected for the standard parts are stored in the standard part database. The standard part data are all deleted in the contents, before starting step 1 (501).

The result (standard part data) that is obtained by processing the multi-dimensional data shown in FIG. 2 and the actual production data shown in FIG. 3 with the above-mentioned standard part judging apparatus becomes data shown in FIG. 10.

Figure 12:
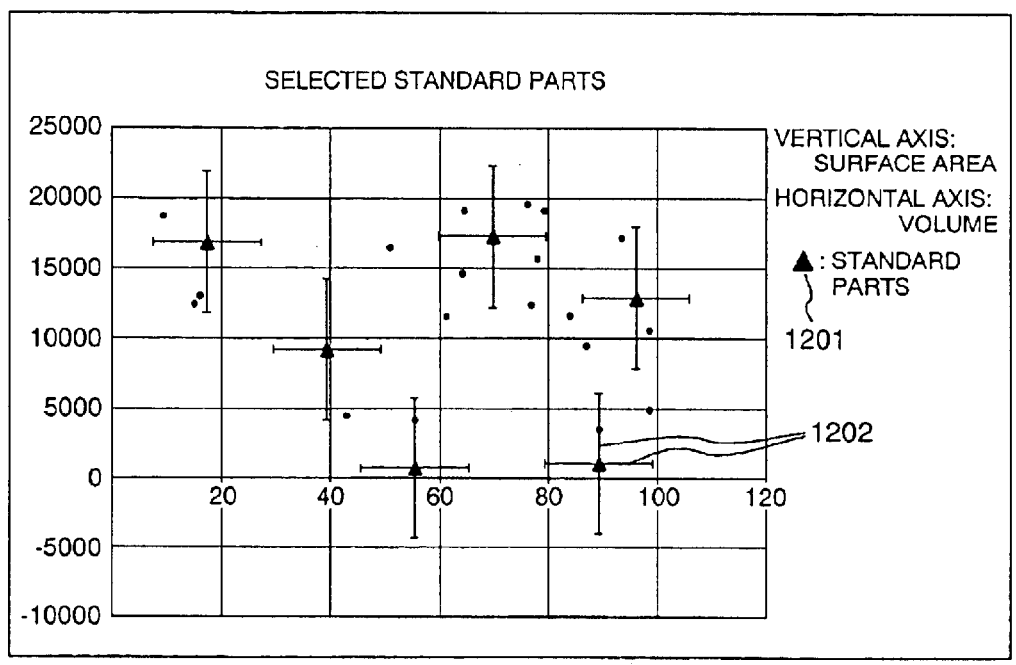
FIG. 12 shows an example of the final display drawing (multi-dimensional board) of the standard part data used in this invention.

The display displays the standard part data in the tabular form, as shown in FIG. 11, and it tells the result to the user. Moreover, the result may be displayed as shown in FIG. 12. In FIG. 12, two attributes used for the nearby range are assigned to the vertical axis and the horizontal axis of the graph, and the points corresponding to each part are plotted at positions.

As for the parts contained in the standard part data, triangle dots 1201 are plotted in the graph so that the user understands that they are the standard parts. Moreover, the range line 1202 is drawn so that the nearby range for the standard parts may be known. Any attributes for plotting the parts are acceptable if they are multi-dimensional data. However, only when plots of the attributes included in the nearby range are used, the range lines 1202 are drawn.

Figure 16:
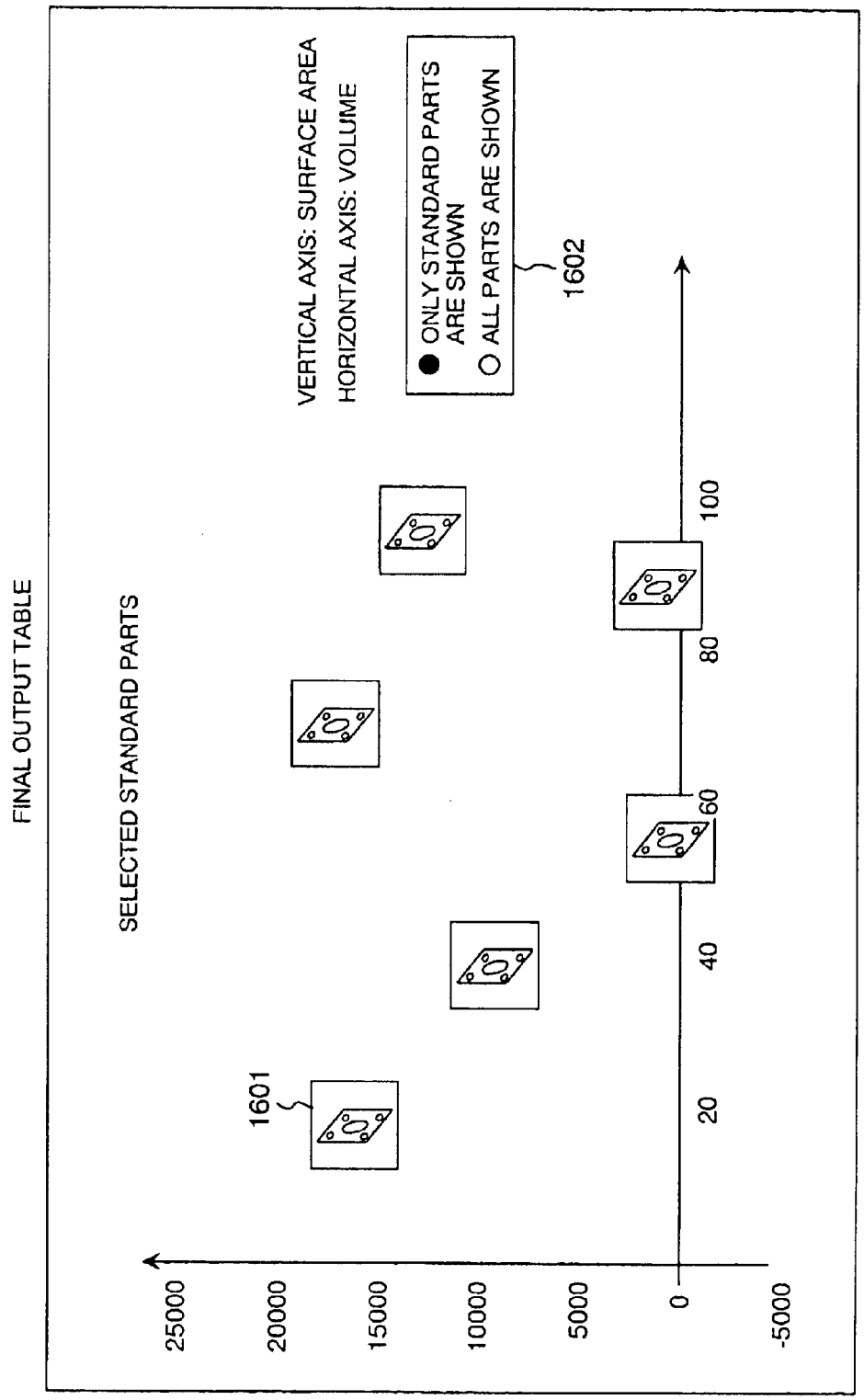
FIG. 16 shows the final display drawing of the standard part data used in this invention.

Moreover, the data may be indicated as shown in FIG. 16. In this example of indication, the small images (thumbnails) 1601 are indicated for showing parts, while the parts are plotted by points in FIG. 12. Although all parts are plotted in FIG. 12, it is possible to select the display of only standard parts or the display of all parts by the use of a button 1602 in this example (FIG. 16 displays only standard parts). Moreover, the color of the frame of the thumbnails expresses the quantity of production or the accumulated quantity of the production.

Although a concrete apparatus can be realized by constituting a general-purpose computer system comprising the components shown in FIG. 4 and a processing program that works on the computer system. It is possible to constitute the system for the exclusive use.

Figure 14:
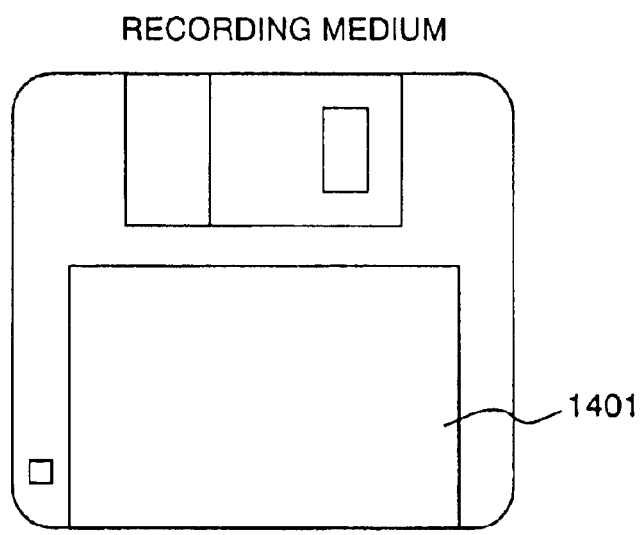
FIG. 14 is a figure of a magnetic disk used in the invention.
Figure 15:
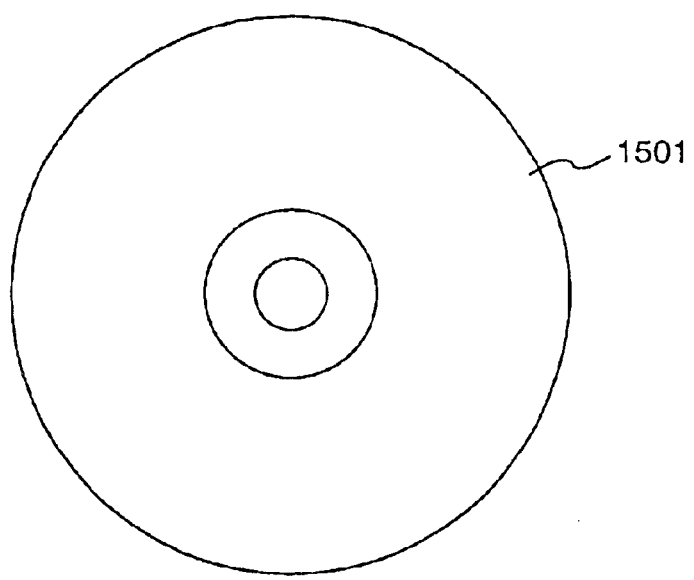
FIG. 15 shows CD-ROM used in this invention.

When realizing the apparatus by adding a processing program to the general-purpose computer systems, the processing program is recorded in information recording media (an information recording medium in which data are able to be read out by a computer), such as CD-ROM1501 as shown in FIG. 15 or a magnetic disk 1401 as shown in FIG. 14. The data are delivered, interpolated and mounted. Then, the data are read out with a magnetic-disk reading apparatus or a CD-ROM reading apparatus, which are disposed in the central arithmetic unit 401. The data are taken into the internal memory 403.

When realizing the apparatus by taking in the processing program delivered through a communication network, using the input section, the taken-in processing program is memorized and stored in the media, such as the magnetic disk so that the program can be repeatedly used. As an example of such general-purpose computer systems, personal computers, office computers, workstations, etc. can be used.

As having been described, the part standardization support system and the method of selecting standard parts are provided by the present invention in which the attributes and the nearby range in connection with similarity of parts are indicated explicitly. Since, in the conventional method, each attribute and q contour feature of parts are represented and are verified by only one value of the degree of similarity, the definition of the degree of similarity is not direct. That is, if the user who selects standard parts does not fully understand the definition of the degree of similarity, it is difficult for him or her to expect the proper selection of the standard parts.

The present invention provides a support system for selecting parts that are suitable for standard parts, using data of plural parts, which comprises a multi-dimensional database storage for storing multi-dimensional data representing attributes of parts, an actual production database storage for storing actual production data representing quantity of production of parts, a nearby range data inputting apparatus for preparing nearby range data upon receipt of nearby range values corresponding to attributes, a standard part judging apparatus for reading out the actual production quantity data stored in the actual production quantity database storage, selecting standard parts using the nearby range data from the read-out data, and outputting standard parts data, and a display for displaying the standard parts data.

That is, by specifying the parameters used for selecting the standard parts, the parameters, which may give influence on the selection of the standard parts, become explicit, and the degree of influence will be grasped directly by specifying the nearby range. Therefore, even beginners are able to select the standard parts.

Although the actual production data were used as a standardization parameter in the above-mentioned example, other parameters such as the cost of processing in the company or a purchase price of parts can be used. Although in the above example, the second database has a different constitution than that of the first database, it is possible to constitute them as one item of the first database. As a result, it can be expected that reduction in storage capacity or volume and an access speed to data will increase.

As mentioned above, the parameters, which give influences on selection of the standard parts, are explicit, and hence the present invention provides a part standardization support system and a method therefore.

What is claimed is:

1. A support system for selecting standard parts from plural candidate parts for parts standardization determination, which comprises:
   a first database storage for storing data representing attributes of the plural candidate parts,
   a second database storage for storing standardization parameter data representing criteria useable during analysis as to which candidate part of the plural candidate parts should be selected as a standard part,
   an accumulation range input device to set a predetermined accumulation parameter range to be used with respect to a subject parameter of interest,
   an accumulation unit to use data from the first database storage to accumulate, for each selected parameter value of a plurality of selected parameter values, an accumulation total corresponding to one of the plural candidate parts having actual parameters falling within the predetermined accumulation range as measured from the selected parameter value, so as to determine a plurality of accumulation totals corresponding respectively to the plurality of selected parameter values, and
   a standard parts judging unit to compare ones of the plurality of accumulation totals to each other, to select which candidate part is selected as the standard part.

2. The support system as defined in claim 1, which comprises a display for displaying the standardization parameter data.

3. The support system as defined in claim 1, wherein at least one of the standardization parameter data corresponds to one of the attributes represented within the first database storage, and the actual parameters are actual attribute values of the plural candidate parts, and wherein the predetermined accumulation parameter range is a numerical value representing a maximum allowable deviation of an attribute value as measured from the selected parameter value in order to be accumulated into the accumulation total.

4. The support system as defined in claim 1, wherein the accumulation total having a largest accumulation total is used to select which candidate part is selected as the standard part.

5. The support system as defined in claim 1, which comprises a display for displaying data for the candidate part selected as the standard part.

6. The support system as defined in claim 1, wherein at least one of the standardization parameter data includes production quantity data corresponding to the plural candidate parts, wherein the accumulation unit uses the production quantity data to accumulate each of the accumulation totals.

7. The support system as defined in claim 1, wherein at least one of the standardization parameter data includes cost of processing data corresponding to the plural candidate parts, wherein the accumulation unit uses the cost of processing data to accumulate each said accumulation total.

8. The support system as defined in claim 1, wherein at least one of the standardization parameter data includes purchase price data corresponding to the plural candidate parts, wherein the accumulation unit uses the purchase price data to accumulate each said accumulation total.

9. A support method for selecting standard parts from plural candidate parts for parts standardization determination, which comprises:
   storing data representing attributes of the plural candidate parts,
   storing standardization parameter data representing criteria useable during analysis as to which candidate part of the plural candidate parts should be selected as a standard part,
   setting a predetermined accumulation parameter range to be used with respect to a subject parameter of interest,
   accumulating, for each selected parameter value of a plurality of selected parameter values, an accumulation total corresponding to ones of the plural candidate parts having actual parameters falling within the predetermined accumulation range as measured from the selected parameter value, so as to determine a plurality of accumulation totals corresponding respectively to the plurality of selected parameter values, and comparing ones of the plurality of accumulation totals to each other, to select which candidate part is selected as the standard part.

10. The support method as defined in claim 9, which comprises displaying the standardization parameter data on a display.

11. The support method as defined in claim 9, wherein at least one of the standardization parameter data corresponds to one of the attributes of the plural candidate parts, and the actual parameters are actual attribute values of the plural candidate parts, and wherein the predetermined accumulation parameter range is a numerical value representing a maximum allowable deviation of an attribute value as measured from the selected parameter value in order to be accumulated into the accumulation total.

12. The support method as defined in claim 9, which comprises using the accumulation total having a largest accumulation total to select which candidate part is selected as the standard part.

13. The support method as defined in claim 9, which comprises displaying data for the candidate part selected as the standard part on a display.

14. The support method as defined in claim 9, wherein at least one of the standardization parameter data includes production quantity data corresponding to the plural candidate parts, wherein the production quantity data is used to accumulate each of the accumulation totals.

15. The support method as defined in claim 9, wherein at least one of the standardization parameter data includes cost of processing data corresponding to the plural candidate parts, wherein the cost of processing data is used to accumulate each said accumulation total.

16. The support method as defined in claim 9, wherein at least one of the standardization parameter data includes purchase price data corresponding to the plural candidate parts, wherein the purchase price data is used to accumulate each said accumulation total.

17. A machine-readable medium containing at least one sequence of instructions to assist in selecting standard parts from plural candidate parts for parts standardization determination, the sequence of instruction, when executed, causes machine to:
  allow storing of data representing attributes of the plural candidate parts,
  allow storing of standardization parameter data representing criteria useable during analysis as to which candidate part of the plural candidate parts should be selected as a standard part,
  allow setting of a predetermined accumulation parameter range to be used with respect to a subject parameter of interest,
  accumulate, for each selected parameter value of a plurality of selected parameter values, an accumulation total corresponding to ones of the plural candidate parts having actual parameters failing within the predetermined accumulation range as measured from the selected parameter value, so as to determine a plurality or accumulation totals corresponding respectively to the plurality of selected parameter values, and
  compare ones of the plurality of accumulation totals to each other, to select which candidate part is selected as the standard part.

18. The machine-readable medium as defined in claim 17, wherein the sequence of instruction, when executed, cases the machine to:
  display the standardization parameter date on a display.

19. The machine-readable medium as defined in claim 17, wherein at least one of the standardization parameter data corresponds to one of the attributes of the plural candidate parts, and the actual parameters are actual attribute values of the plural candidate parts, and wherein the predetermined accumulation parameter range is a numerical value representing a maximum allowable deviation of an attribute value as measured from the selected parameter value in order to be accumulated into the accumulation total.

20. The machine-readable medium as defined in claim 17, wherein the sequence of instruction, when executed, cases the machine to:
  use the accumulation total having a largest accumulation total to select which candidate pert is selected as the standard part.

21. The machine-readable medium as defined in claim 17, wherein the sequence of instruction, when executed, cases the machine to:
  display data for the candidate part selected as the standard part on a display.

22. The machine-readable medium as defined in claim 17, wherein at least one of the standardization parameter data includes production quantity data corresponding to the plural candidate parts, wherein the production quantity data is used to accumulate each of the accumulation totals.

23. The machine-readable medium as defined in claim 17, wherein at least one of the standardization parameter data includes cost of processing data corresponding to the plural candidate parts, wherein the cost of processing data is used to accumulate each said accumulation total.

24. The machine-readable medium as defined in claim 17, wherein at least one of the standardization parameter data includes purchase price data corresponding to the plural candidate parts, wherein the purchase price data is used to accumulate each said accumulation total.

* * * * *